(12) United States Patent
Mao

(10) Patent No.: US 12,048,113 B2
(45) Date of Patent: Jul. 23, 2024

(54) CHASSIS DEVICE ADAPTED FOR AN EXPANSION DEVICE AND SERVER THEREWITH

(71) Applicant: Wistron Corporation, New Taipei (TW)

(72) Inventor: Zhong-Hui Mao, New Taipei (TW)

(73) Assignee: Wistron Corporation, New Taipei (TW)

( * ) Notice: Subject to any disclaimer, the term of this patent is extended or adjusted under 35 U.S.C. 154(b) by 185 days.

(21) Appl. No.: 17/903,068

(22) Filed: Sep. 6, 2022

(65) Prior Publication Data

US 2023/0413469 A1    Dec. 21, 2023

(30) Foreign Application Priority Data

Jun. 13, 2022    (CN) .......................... 202210662368.9

(51) Int. Cl.
| | |
|---|---|
| G06F 1/16 | (2006.01) |
| H05K 5/00 | (2006.01) |
| H05K 7/00 | (2006.01) |
| H05K 7/14 | (2006.01) |

(52) U.S. Cl.
CPC ......... *H05K 7/1489* (2013.01); *H05K 7/1405* (2013.01); *H05K 7/1408* (2013.01); *H05K 7/1424* (2013.01); *H05K 7/1429* (2013.01); *H05K 7/1487* (2013.01)

(58) Field of Classification Search
CPC .. H05K 7/1489; H05K 7/1405; H05K 7/1408; H05K 7/1424; H05K 7/1429; H05K 7/1487
See application file for complete search history.

(56) References Cited

U.S. PATENT DOCUMENTS

| | | | |
|---|---|---|---|
| 6,173,843 B1* | 1/2001 | Christensen ............ | G06F 1/184 361/801 |
| 11,703,919 B1* | 7/2023 | Zhong .................. | H05K 7/1487 361/759 |
| 2003/0022530 A1* | 1/2003 | Clements ................ | G06F 1/185 439/61 |
| 2004/0212975 A1* | 10/2004 | Chen ....................... | G06F 1/184 361/801 |
| 2006/0087801 A1* | 4/2006 | Champion .............. | G06F 1/185 361/679.41 |
| 2007/0177267 A1* | 8/2007 | Chen ....................... | G06F 1/185 359/514 |

(Continued)

*Primary Examiner* — Anthony M Haughton
(74) *Attorney, Agent, or Firm* — Winston Hsu

(57) ABSTRACT

A chassis device adapted for an expansion device is provided and includes a case, a base and a latch. The case includes an avoiding portion. The base is disposed on the case. At least one accommodating portion is formed on the base. The latch includes at least one pivoting portion, a first abutting portion and a second abutting portion. The at least one pivoting portion is movably disposed through the at least one accommodating portion. The latch is slidable between a locking position and a non-locking position. The first abutting portion and the second abutting portion respectively abut against the case and the expansion device when the latch is located at the locking position, and the avoiding portion allows the latch to pivot when the latch is located at the non-locking position. Besides, a server including the aforementioned chassis device is provided.

20 Claims, 17 Drawing Sheets

(56) References Cited

U.S. PATENT DOCUMENTS

| | | | |
|---|---|---|---|
| 2013/0105647 A1* | 5/2013 | He | G06F 1/186 |
| | | | 248/221.11 |
| 2016/0018859 A1* | 1/2016 | Mao | H05K 7/1405 |
| | | | 211/41.17 |
| 2016/0095237 A1 | 3/2016 | Hou | |
| 2019/0182977 A1* | 6/2019 | Lee | G11B 33/00 |
| 2022/0064994 A1* | 3/2022 | Shih | E05B 47/0038 |
| 2022/0174834 A1* | 6/2022 | Li | H05K 7/1401 |
| 2023/0225070 A1* | 7/2023 | Hung | G06F 1/185 |
| | | | 361/679.32 |
| 2024/0081015 A1* | 3/2024 | Liu | H05K 5/0221 |

* cited by examiner

CHASSIS DEVICE ADAPTED FOR AN EXPANSION DEVICE AND SERVER THEREWITH

BACKGROUND OF THE INVENTION

1. Field of the Invention

The present invention relates to a chassis device and a server therewith, and more specifically, to a chassis device adapted for an expansion device and a server therewith.

2. Description of the Prior Art

With advancement of technology, chassis devices of computers, servers or work stations can be equipped with several expansion devices, such as expansion cards, for increasing expandability and computing performance. A conventional expansion device is usually fixed onto a chassis device by a fastening component, such as a screw member. However, it has a difficult operation. Besides, there is another conventional expansion device which can be fixed onto a chassis device by a pressing button. However, it not only occupies a larger space but also requires a larger aperture formed on the chassis device, which reduces space utilization and fails to comply with safety standards.

SUMMARY OF THE INVENTION

Therefore, it is an objective of the present invention to provide a chassis device adapted for an expansion device and a server therewith for solving the aforementioned problems.

In order to achieve the aforementioned objective, the present invention discloses a chassis device adapted for an expansion device. The chassis device includes a case, a base and a latch. The case includes an avoiding portion. The base is disposed on the case. At least one accommodating portion is formed on the base. The latch includes at least one pivoting portion, a first abutting portion and a second abutting portion. The at least one pivoting portion is movably disposed through the at least one accommodating portion. The latch is slidable between a locking position and a non-locking position. The first abutting portion and the second abutting portion respectively abut against the case and the expansion device when the latch is located at the locking position, and the avoiding portion allows the latch to pivot when the latch is located at the non-locking position.

According to an embodiment of the present invention, the case includes a cooperating portion, and the cooperating portion abuts against the first abutting portion when the latch is located at the locking position.

According to an embodiment of the present invention, the avoiding portion is located at a position corresponding to the first abutting portion of the latch located at the non-locking position, and the cooperating portion is located at a position corresponding to the first abutting portion of the latch located at the locking position.

According to an embodiment of the present invention, the first abutting portion includes a first engaging portion. The cooperating portion includes a second engaging portion, and the first engaging portion engages with the second engaging portion when the cooperating portion abuts against the first abutting portion.

According to an embodiment of the present invention, the first engaging portion is an engaging protrusion, and the second engaging portion is an engaging recess.

According to an embodiment of the present invention, the avoiding portion is a groove or a hole.

According to an embodiment of the present invention, the avoiding portion is an arc-shaped groove. The first abutting portion includes an arc-shaped cooperating structure. A curvature of the avoiding portion matches with a curvature of the arc-shaped cooperating structure. A center of the curvature of the avoiding portion and a center of the curvature of the arc-shaped cooperating structure are coincided with a pivoting axis of the at least one pivoting portion, and the latch pivots away from the non-locking position by a sliding cooperation of the avoiding portion and the arc-shaped cooperating structure.

According to an embodiment of the present invention, the first abutting portion is forced by the case along a first direction for driving the second abutting portion to press the expansion device along a second direction opposite to the first direction when the first abutting portion and the second abutting portion respectively abut against the case and the expansion device.

According to an embodiment of the present invention, the latch further includes a main body and a resilient arm extending from the main body along a sliding direction of the latch, and the first abutting portion is formed on an end of the resilient arm away from the main body.

According to an embodiment of the present invention, the resilient arm is forced to resiliently deform when the first abutting portion abuts against the case.

According to an embodiment of the present invention, the base is a one-piece structure bent from a stripe-shaped structure, a rod-shaped structure, a string-shaped structure or a wire-shaped structure.

According to an embodiment of the present invention, the base includes at least one bending part formed in a U shape, and the at least one accommodating portion is formed between two sides of the at least one bending part.

According to an embodiment of the present invention, the at least one bending part includes a closed end portion and an open end portion. At least one through slot is formed on the case, and the closed end portion and the open end portion are respectively located at two opposite sides of the at least one through slot when the at least one bending part passes through the at least one through slot.

According to an embodiment of the present invention, a width of the at least one through slot is less than a width of the closed end portion, and the two sides of the at least one bending part are forced to resiliently deform during a process that the at least one bending part passes through the at least one through slot.

According to an embodiment of the present invention, the width of the at least one through slot is less than a width of the open end portion.

According to an embodiment of the present invention, the width of the closed end portion is greater than a width of the open end portion.

According to an embodiment of the present invention, the at least one bending part further includes at least one stopping portion connected to the open end portion, and the at least one stopping portion abuts against the case when the at least one bending part passes through the at least one through slot.

In order to achieve the aforementioned objective, the present invention further discloses a server. The server includes an expansion device and a chassis device. The chassis device includes a case, a base and a latch. The case includes an avoiding portion. The base is disposed on the case. At least one accommodating portion is formed on the base. The latch includes at least one pivoting portion, a first abutting portion and a second abutting portion. The at least one pivoting portion is movably disposed through the at least one accommodating portion. The latch is slidable between a locking position and a non-locking position. The first abutting portion and the second abutting portion respectively abut against the case and the expansion device when the latch is located at the locking position, and the avoiding portion allows the latch to pivot when the latch is located at the non-locking position.

According to an embodiment of the present invention, the avoiding portion is an arc-shaped groove. The first abutting portion includes an arc-shaped cooperating structure. A curvature of the avoiding portion matches with a curvature of the arc-shaped cooperating structure. A center of the curvature of the avoiding portion and a center of the curvature of the arc-shaped cooperating structure are coincided with a pivoting axis of the at least one pivoting portion, and the latch pivots away from the non-locking position by a sliding cooperation of the avoiding portion and the arc-shaped cooperating structure.

According to an embodiment of the present invention, the base is a one-piece structure bent from a stripe-shaped structure, a rod-shaped structure, a string-shaped structure or a wire-shaped structure. The base includes at least one bending part formed in a U shape. The at least one accommodating portion is formed between two sides of the at least one bending part. The at least one bending part includes a closed end portion and an open end portion. At least one through slot is formed on the case, and the closed end portion and the open end portion are respectively located at two opposite sides of the at least one through slot when the at least one bending part passes through the at least one through slot.

In summary, in the present invention, the latch can slide and/or pivot relative to the base by the cooperation of the pivoting portion and the accommodating portion to switch relative to the case between the locking position, the non-locking position and the pivotable position. When the latch is located at the locking position relative to the case, the latch abuts against the case and the expansion device for restraining detachment of the expansion device. When it is desired to detach the expansion device, the latch can be operated to slide relative to the case from the locking position to the non-locking position and then further to pivot relative to the case to the pivotable position, so that the latch does not abut against the expansion device for allowing the detachment of the expansion device. Therefore, the present invention has better using convenience. Besides, the aforementioned configuration is space-saving and does not require a large aperture formed on the case. Therefore, the present invention can have better space utilization and comply with safety standards.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "left", "right", "front", "back", etc., is used with reference to the orientation of the Figure(s) being described. The components of the present invention can be positioned in a number of different orientations. As such, the directional terminology is used for purposes of illustration and is in no way limiting. Accordingly, the drawings and descriptions will be regarded as illustrative in nature and not as restrictive. Also, if not specified, the term "connect" or "couple" is intended to mean either an indirect or direct mechanical connection. Thus, if a first device is connected or coupled to a second device, that connection may be through a direct mechanical connection, or through an indirect mechanical connection via other devices and connections.

Figure 1:
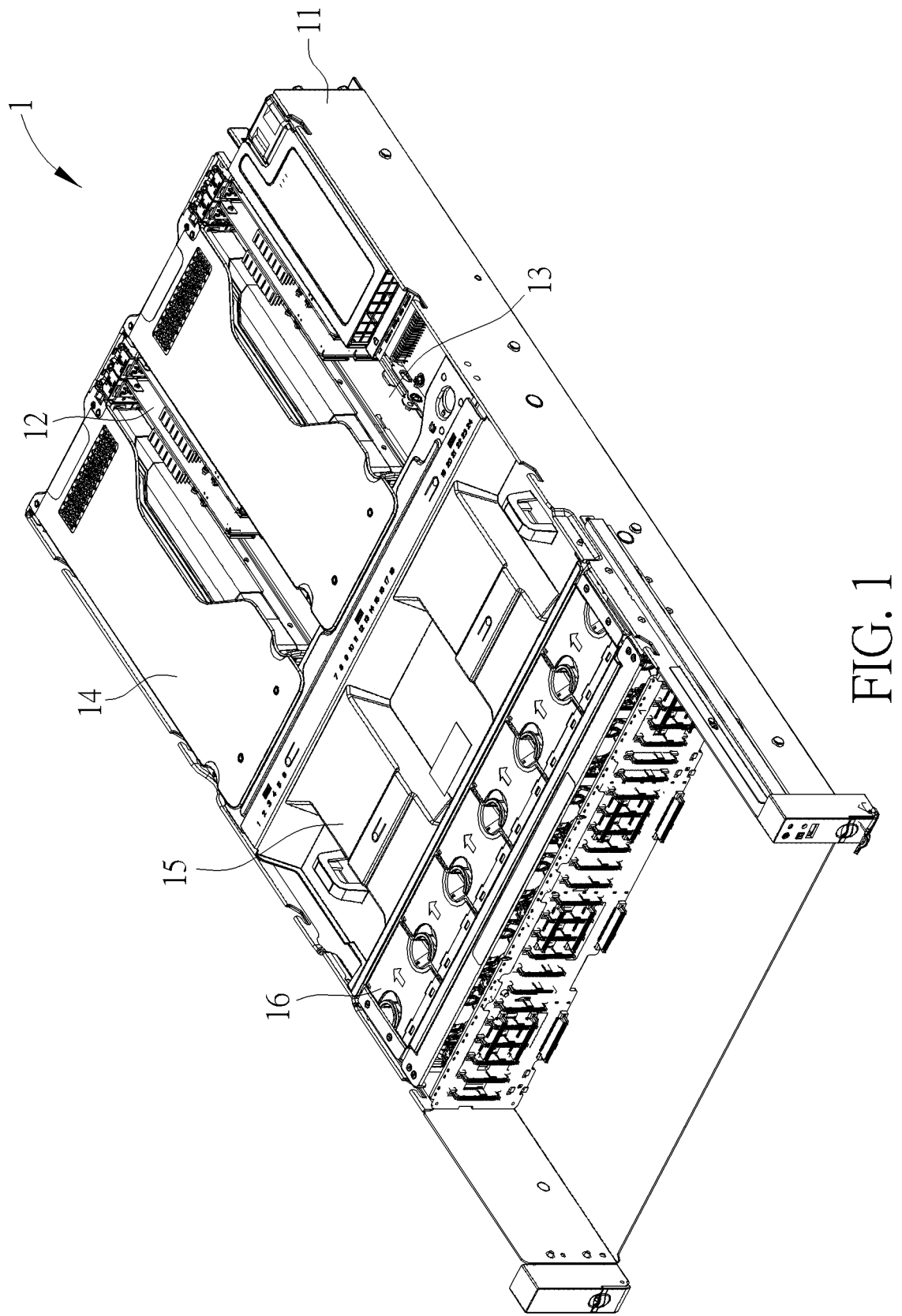
FIG. 1 is a partial diagram of an electronic apparatus according to an embodiment of the present invention.
Figure 6:
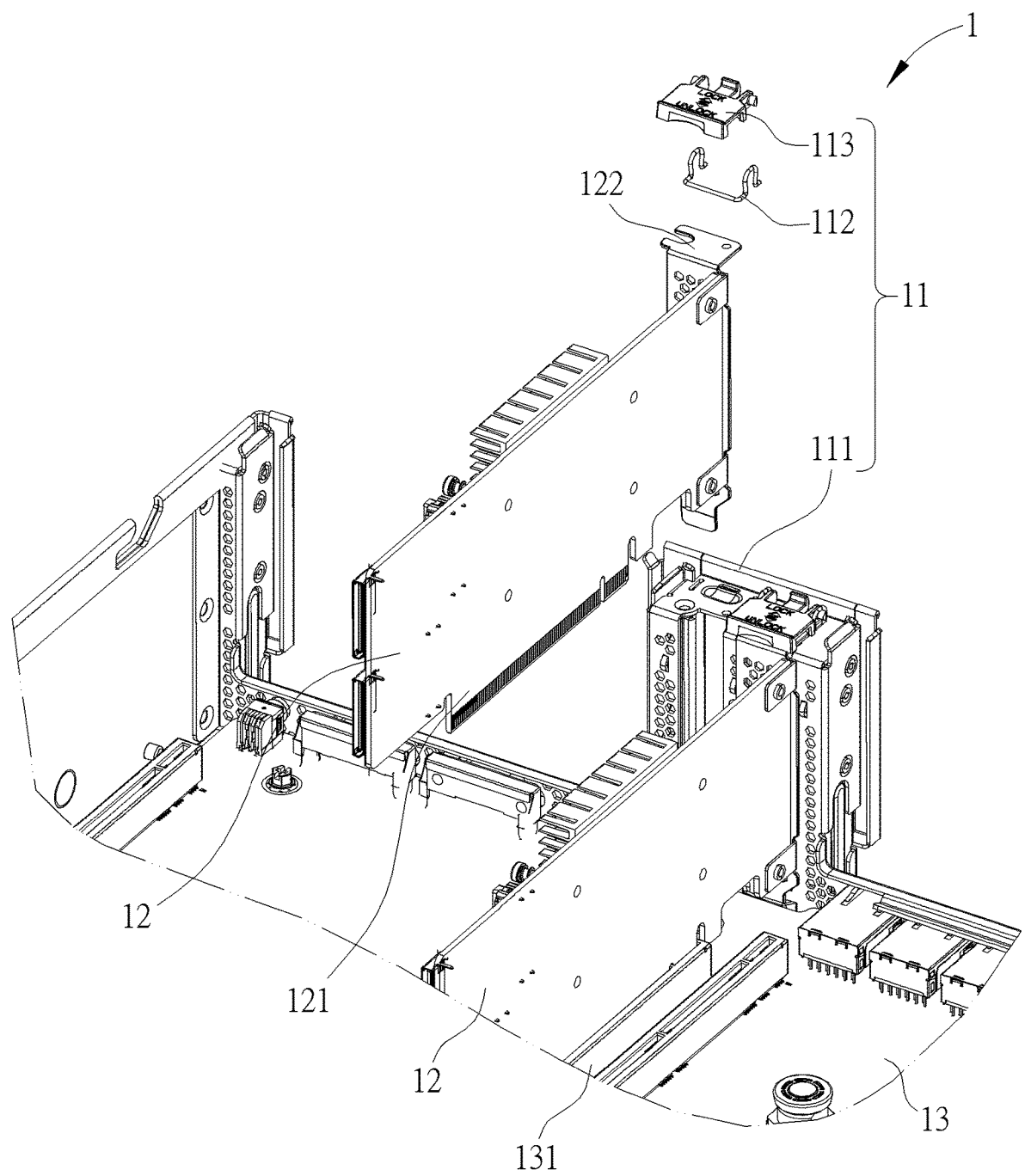
FIG. 6 is a partial exploded diagram of the electronic apparatus according to the embodiment of the present invention.

Please refer to FIG. 1 to FIG. 6. FIG. 1 is a partial diagram of an electronic apparatus 1 according to an embodiment of the present invention. FIG. 2 to FIG. 5 are partial enlarged diagrams of the electronic apparatus 1 in different states according to the embodiment of the present invention. FIG. 6 is a partial exploded diagram of the electronic apparatus 1 according to the embodiment of the present invention. As shown in FIG. 1 to FIG. 6, the electronic apparatus 1 includes a chassis device 11, at least one expansion device 12 and a base plate 13. The base plate 13 can be a system mainboard, whereon at least one expansion slot 131 is formed. The expansion slot 131 is for a pin assembly 121 of the expansion device 12 to be inserted therein. The expansion device 12 is installed on the base plate 13 by insertion of the pin assembly 121 into the expansion slot 131. The chassis device 11 is configured to allow or restrain detachment of the expansion device 12.

In this embodiment, the electronic apparatus 1 can be a server, and the expansion device 12 can be an expansion card. As shown in FIG. 1, the electronic device 1 can further include at least one graphic processing unit 14, at least one central processing unit 15, at least one heat dissipating device 16 and/or at least one storage device, which is not shown in the figure. However, the present invention is not limited to this embodiment. For example, in another embodiment, the electronic apparatus can be an industrial computer or a personal computer, and the expansion device can be a memory card or a battery.

Figure 2:
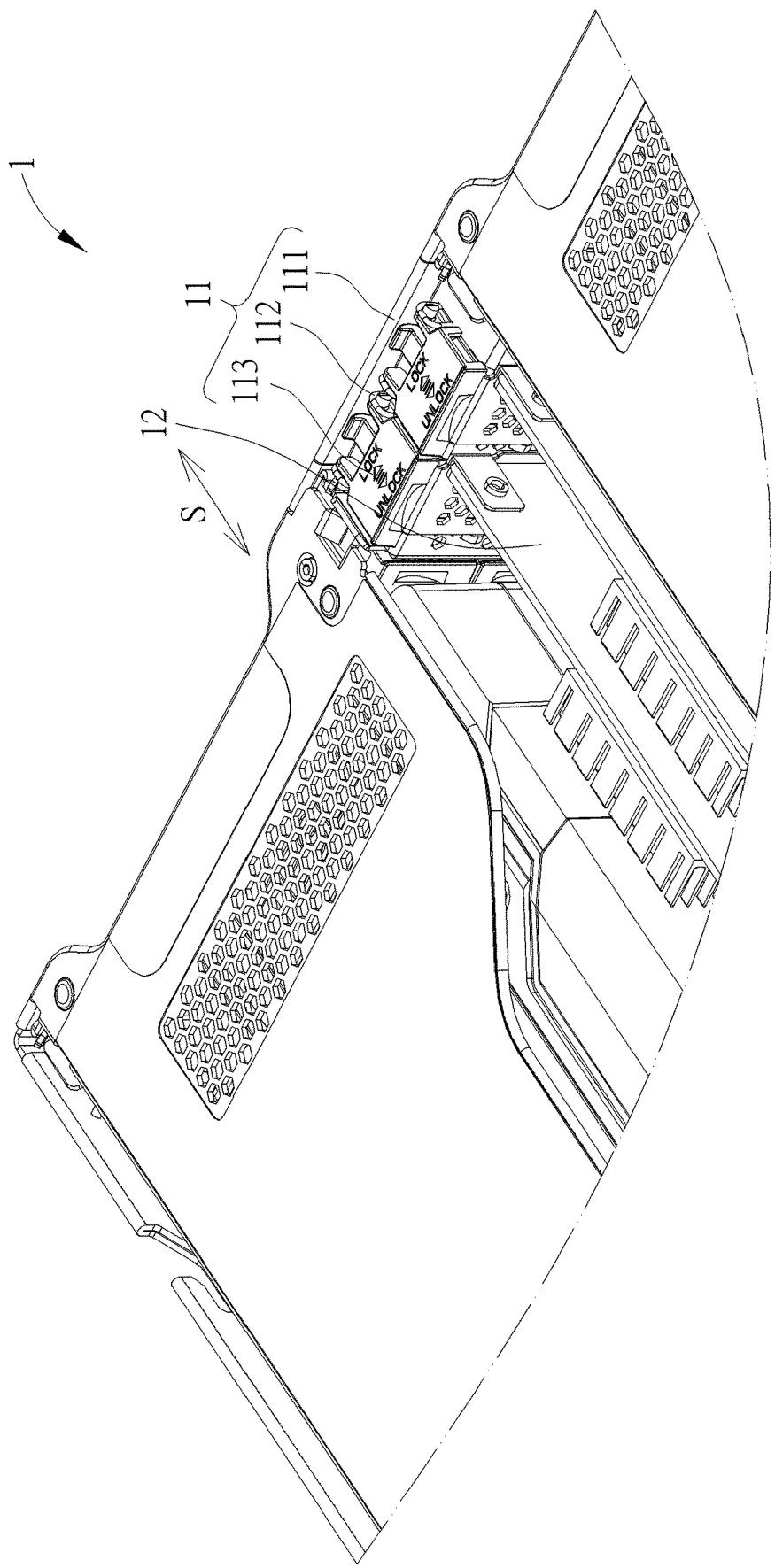
FIG. 2 to FIG. 5 are partial enlarged diagrams of the electronic apparatus in different states according to the embodiment of the present invention.
Figure 3:
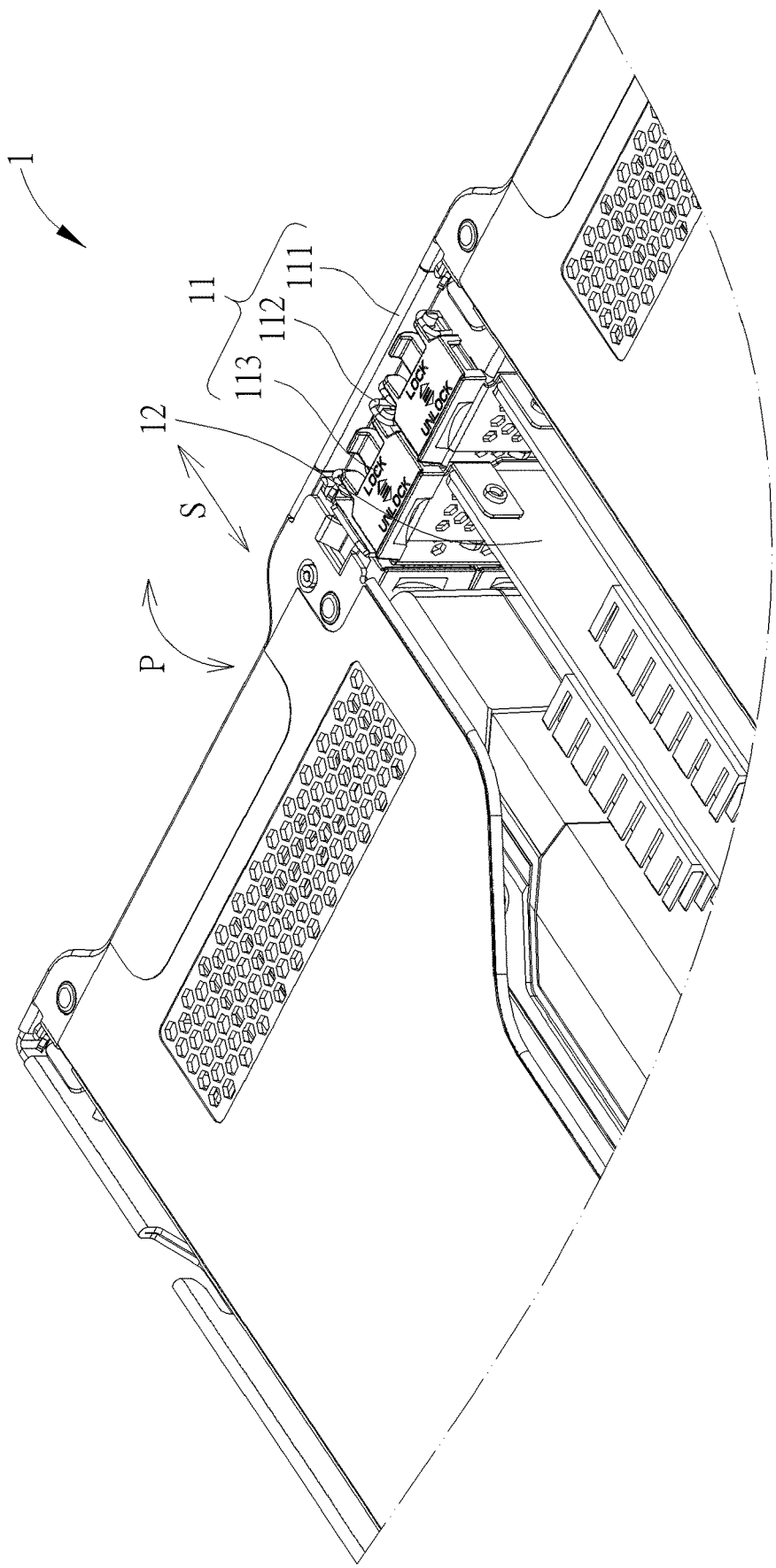
Figure 4:
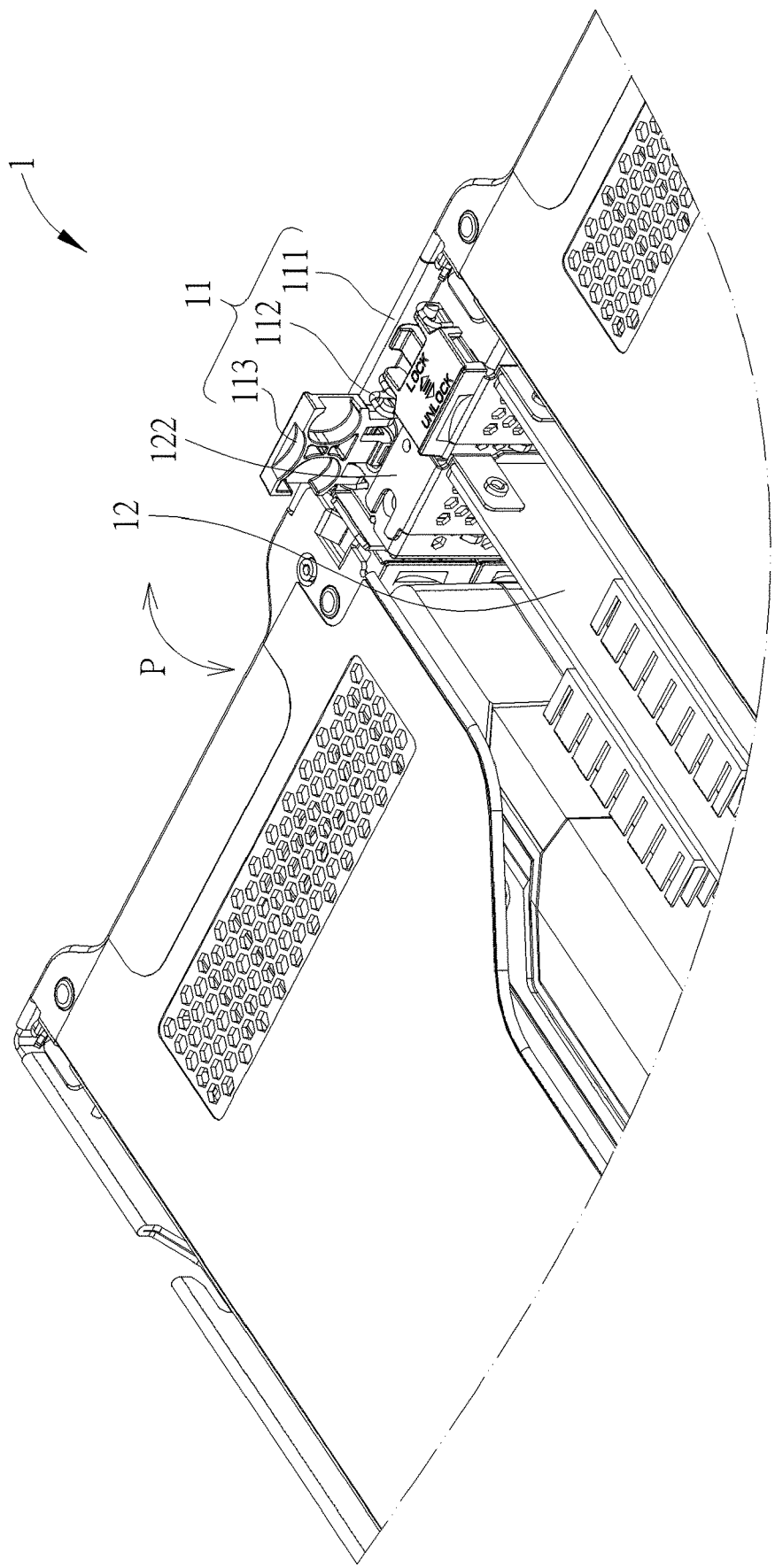
Figure 5:
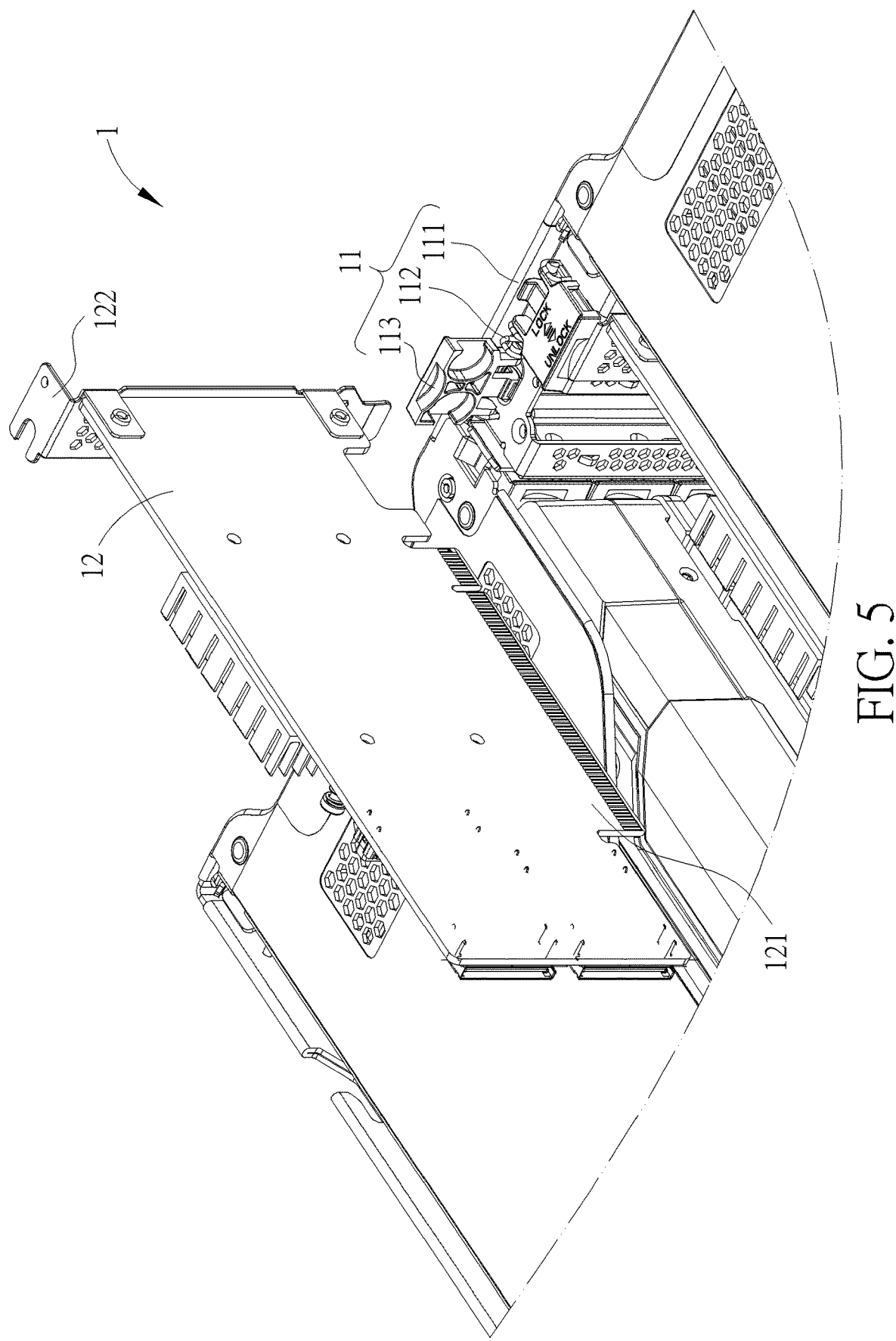

As shown in FIG. 2 to FIG. 6, the chassis device 11 includes a case 111, a base 112 and at least one latch 113. The base 112 is disposed on the case 111. The latch 113 is movably coupled to the base 112 and slidable relative to the case 111 between a locking position as shown in FIG. 2 and a non-locking position as shown in FIG. 3 along a sliding direction S and/or pivotable between the non-locking position as shown in FIG. 3 and a pivotable position as shown in FIG. 4 along a pivoting direction P by a cooperation of the latch 113 and the base 112. When the latch 113 is located at the locking position as shown in FIG. 2 relative to the case 111, the latch 113 abuts against the case 111 and the expansion device 12, so that the expansion device 12 is forced to be restrained from being detached. At this moment, the latch 113 is stopped by the case 111 and the expansion device 12 from pivoting relative to the case 111 along the pivoting direction P but still can slide relative to the case 111 along the sliding direction S from the locking position as shown in FIG. 2 to the non-locking position as shown in FIG. 3. When the latch 113 is located at the non-locking position as shown in FIG. 3 relative to the case 111, the latch 113 is not stopped by the case 111 anymore, so that the latch 113 is pivotable relative to the case 111 from the non-locking position as shown in FIG. 3 to the pivotable position as shown in FIG. 4 along the pivoting direction P. When the latch 113 is located at the pivotable position as shown in FIG. 4 relative to the case 111, the latch 113 does not abut against the expansion device 12, i.e., the latch 113 is separated from the expansion device 12. At this moment, the expansion device 12 is not forced by the latch 113 anymore, so that the expansion device 12 can be detached from the base plate 13.

It should be noticed that, in this embodiment, as shown in FIG. 4, when the latch 113 is located at the pivotable position, a pivoting angle of the latch 113 is 90 degrees. However, the present invention is not limited to this embodiment. The pivoting angle of the latch 113 located at the pivotable position can be any degree according to practical demands. For example, in another embodiment, the pivoting angle of the latch 113 located at the pivotable position can be any degree from 0 to 90 degrees. Alternatively, in another embodiment, the pivoting angle of the latch 113 located at the pivotable position can be any degree from 60 to 120 degrees.

Specifically, in this embodiment, the base plate 13 can be fixed onto the case 111 by a fastening component, such as a screw member. The expansion device 12 can further include a bracket 122. The bracket 122 rests on a lateral wall of the case 111 when the expansion device 12 is installed on the base plate 13. When the latch 113 is located at the locking position as shown in FIG. 2 relative to the case 111, the bracket 122 of the expansion device 12 is clamped by the latch 113 and the case 111, so that the expansion device 12 cannot be detached from the base plate 13. However, the present invention is not limited to this embodiment.

Figure 7:
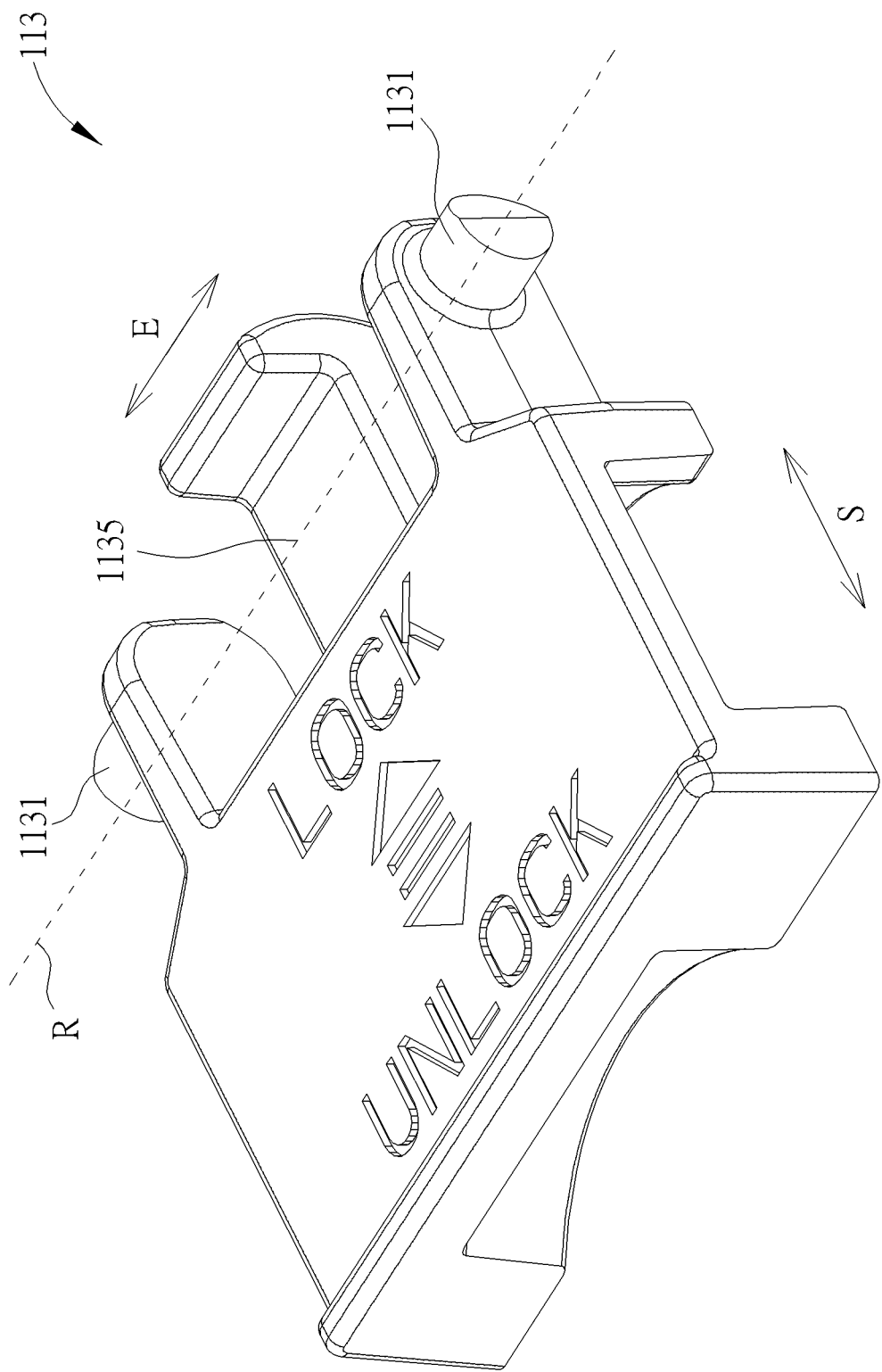
FIG. 7 to FIG. 9 are diagrams of a latch at different views according to the embodiment of the present invention.
Figure 8:
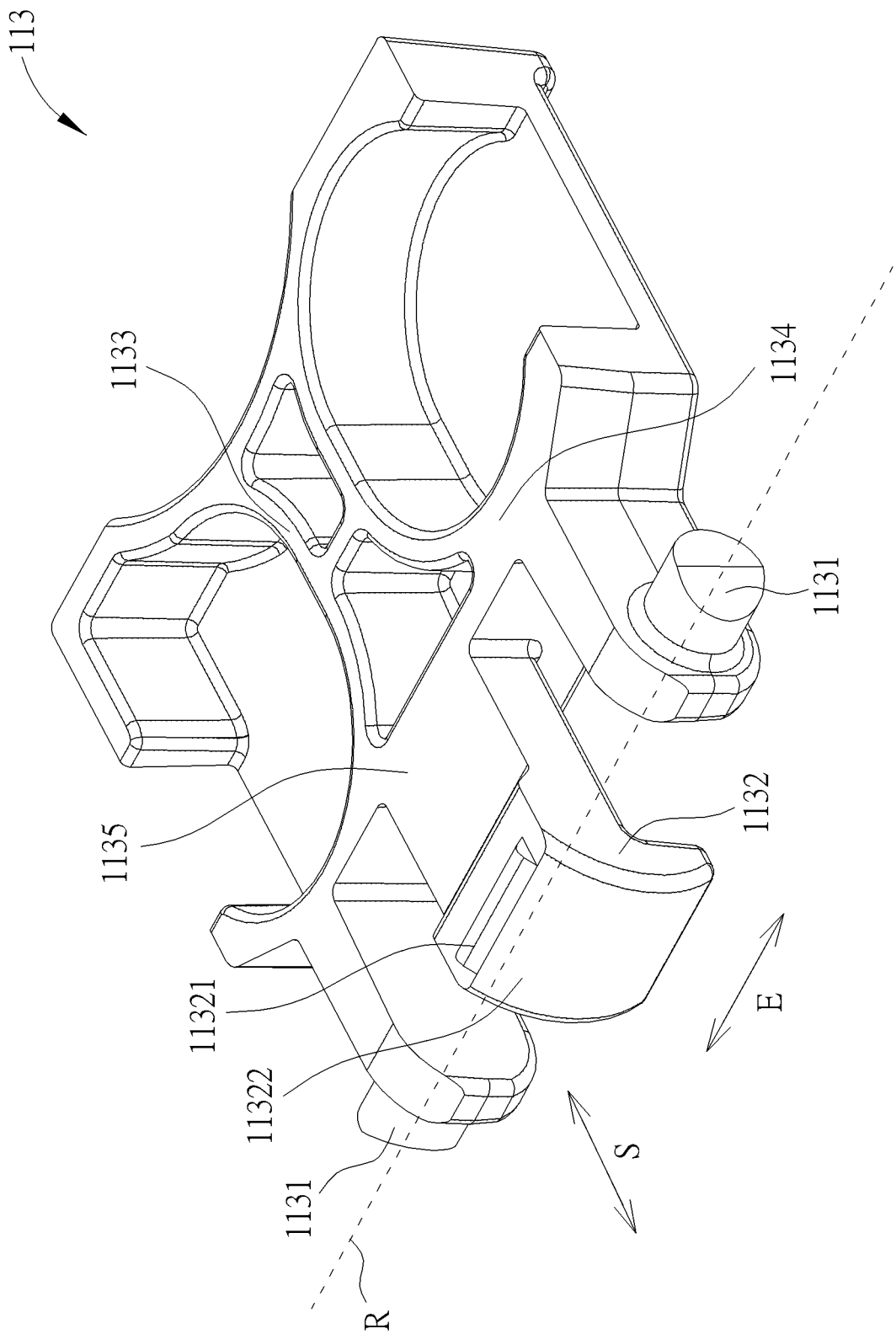
Figure 9:
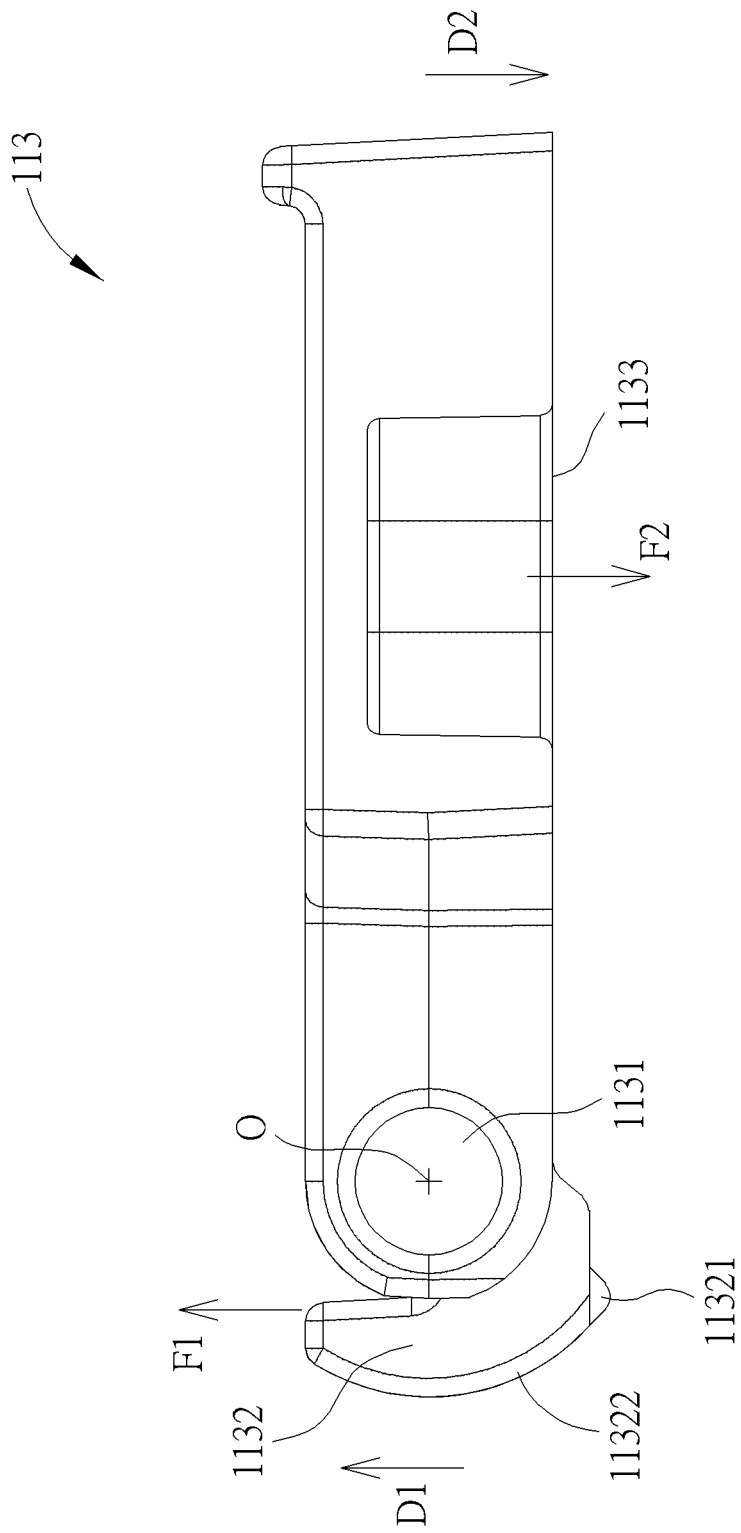
Figure 10:
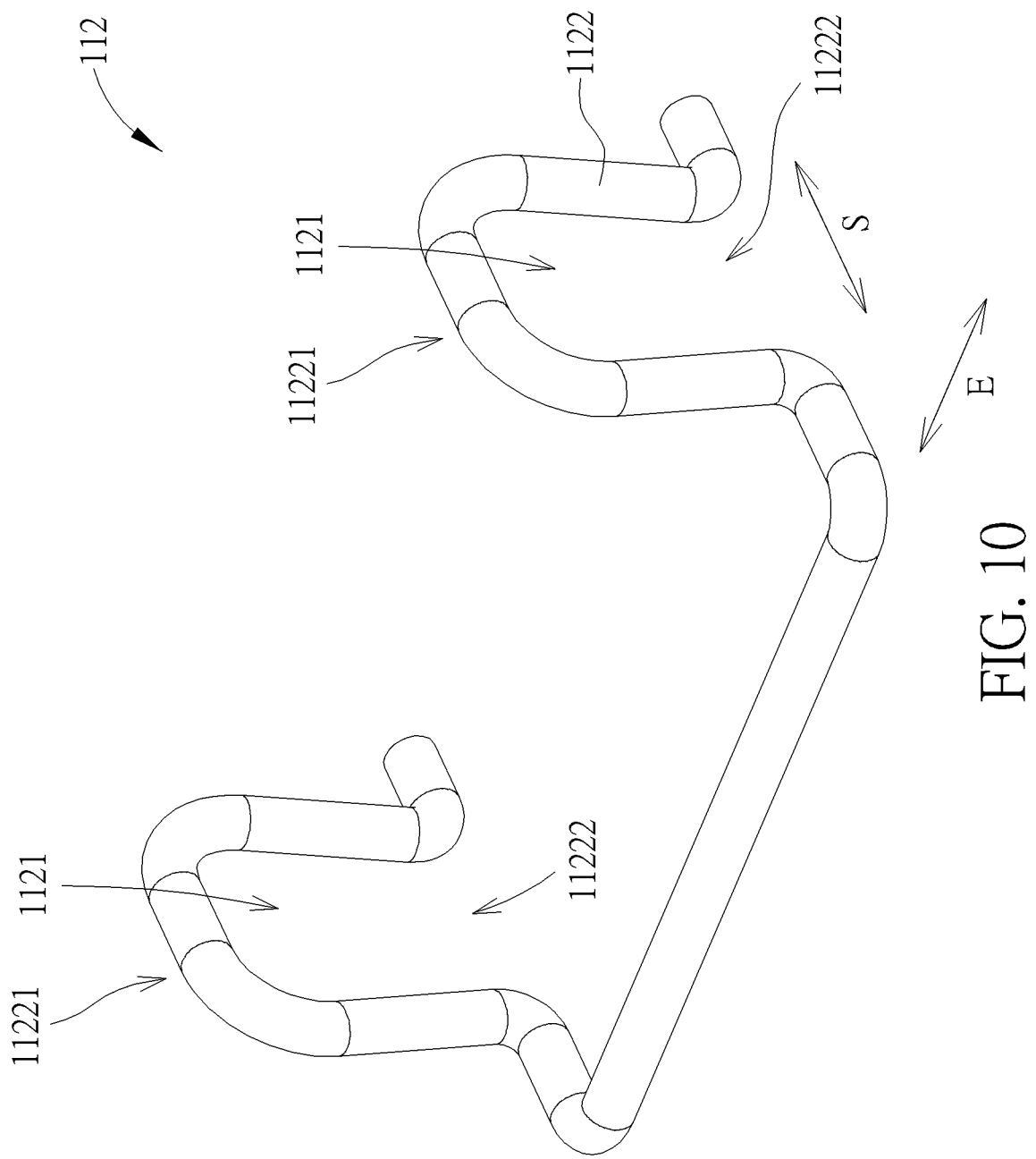
FIG. 10 is a diagram of a base according to the embodiment of the present invention.
Figure 11:
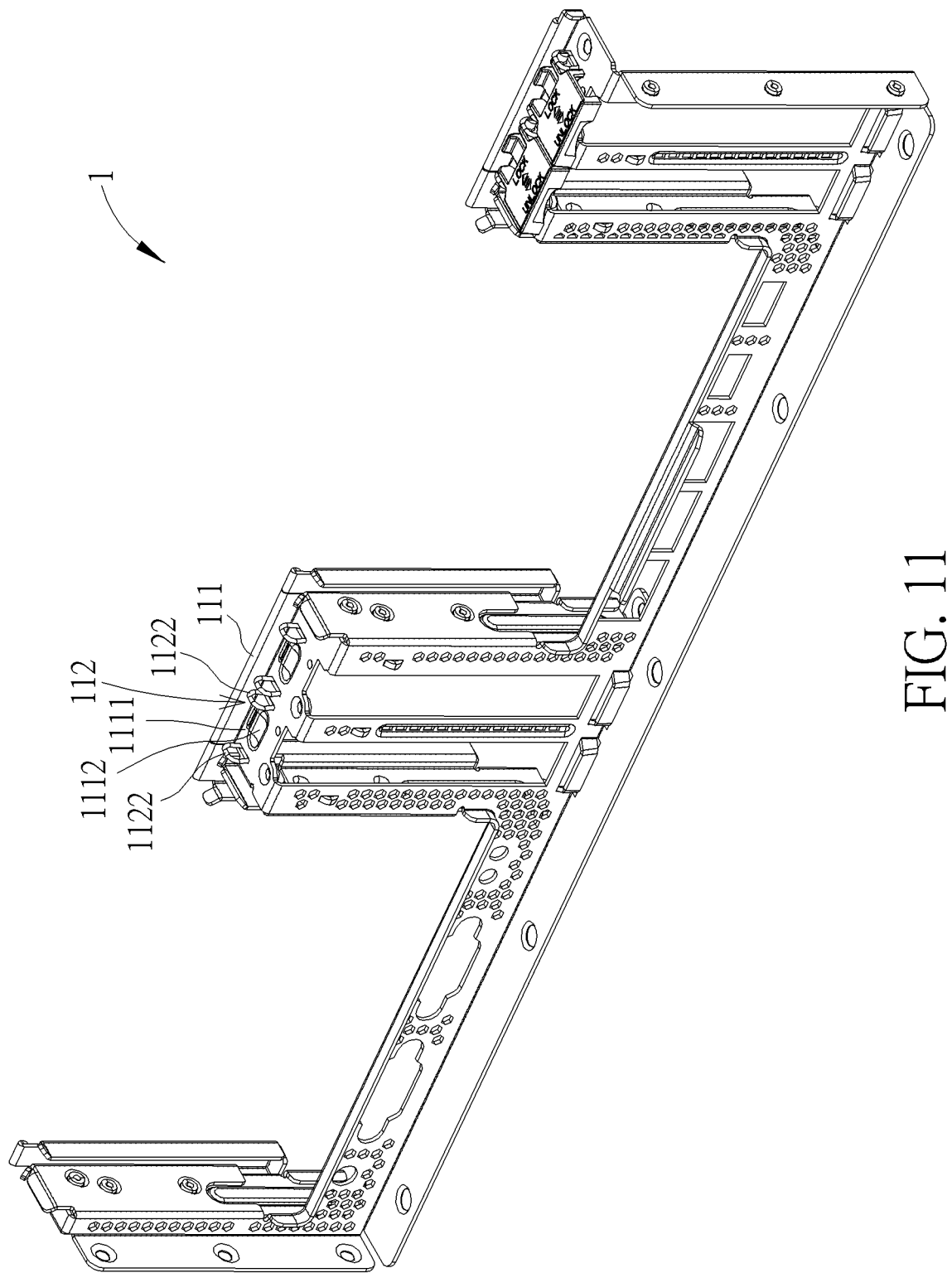
FIG. 11 and FIG. 12 are diagrams of the electronic apparatus at different views as the base is disposed on a case according to the embodiment of the present invention.
Figure 12:
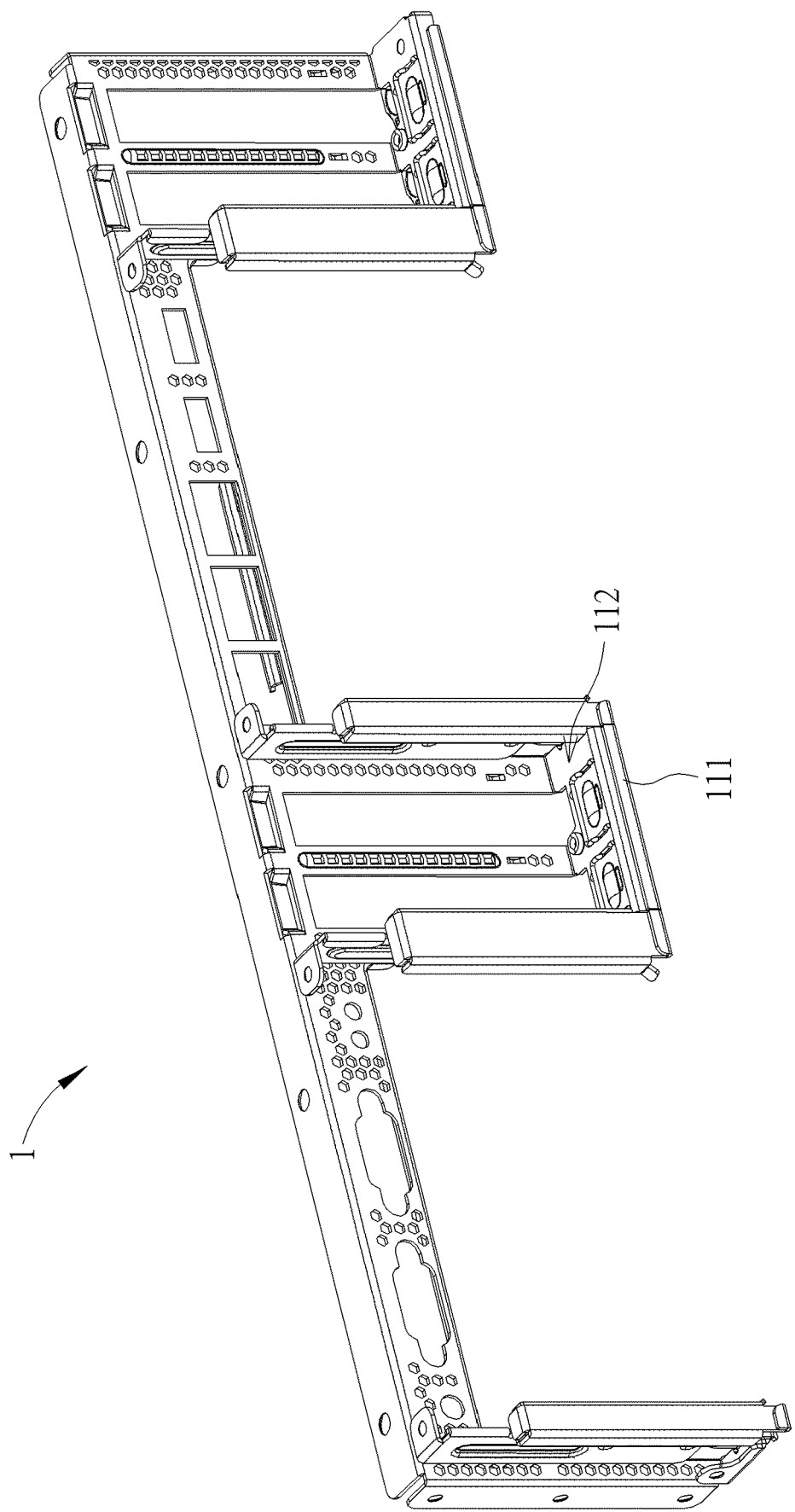
Figure 13:
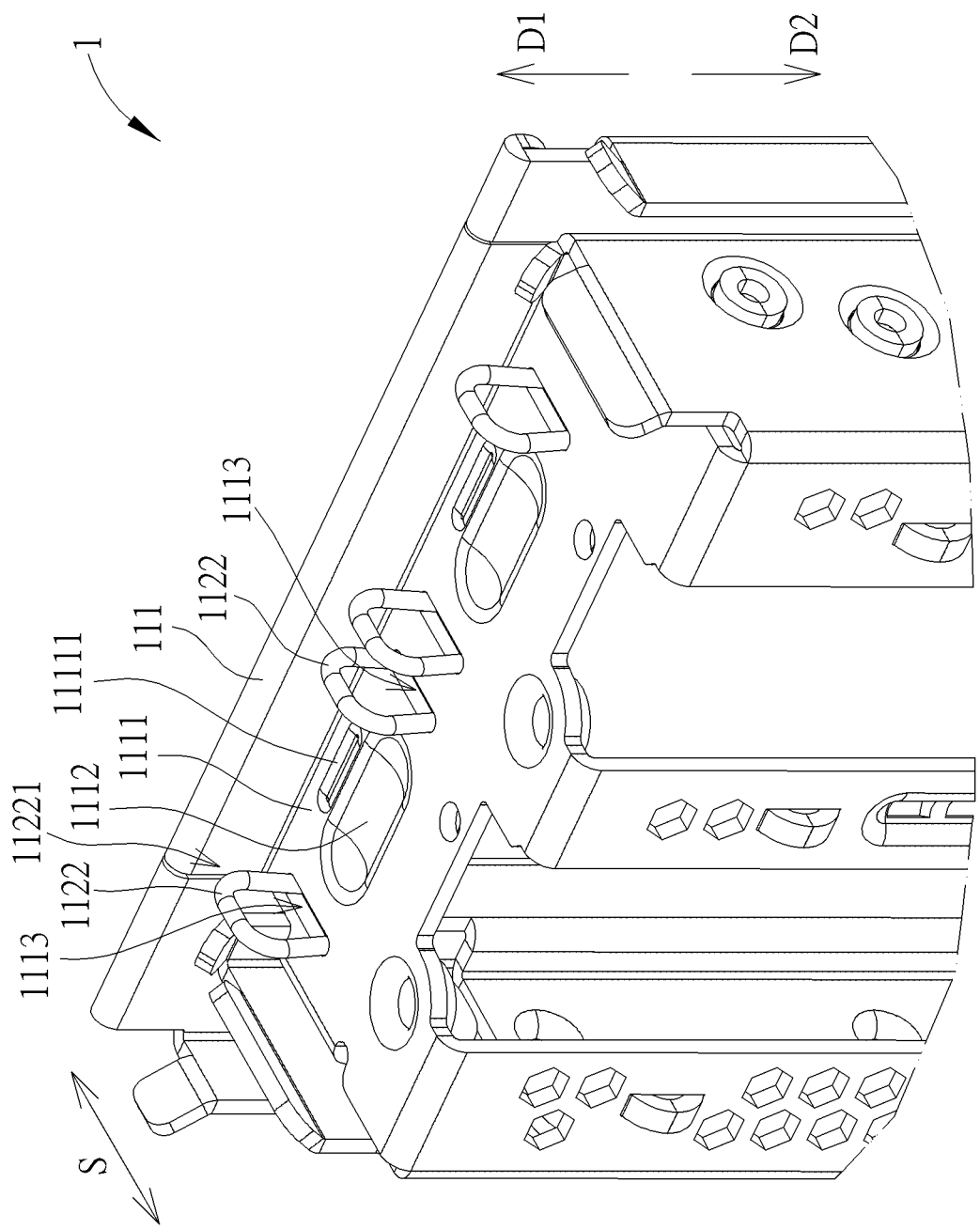
FIG. 13 and FIG. 14 are partial enlarged diagrams of the electronic apparatus at different views as the base is disposed on the case according to the embodiment of the present invention.
Figure 14:
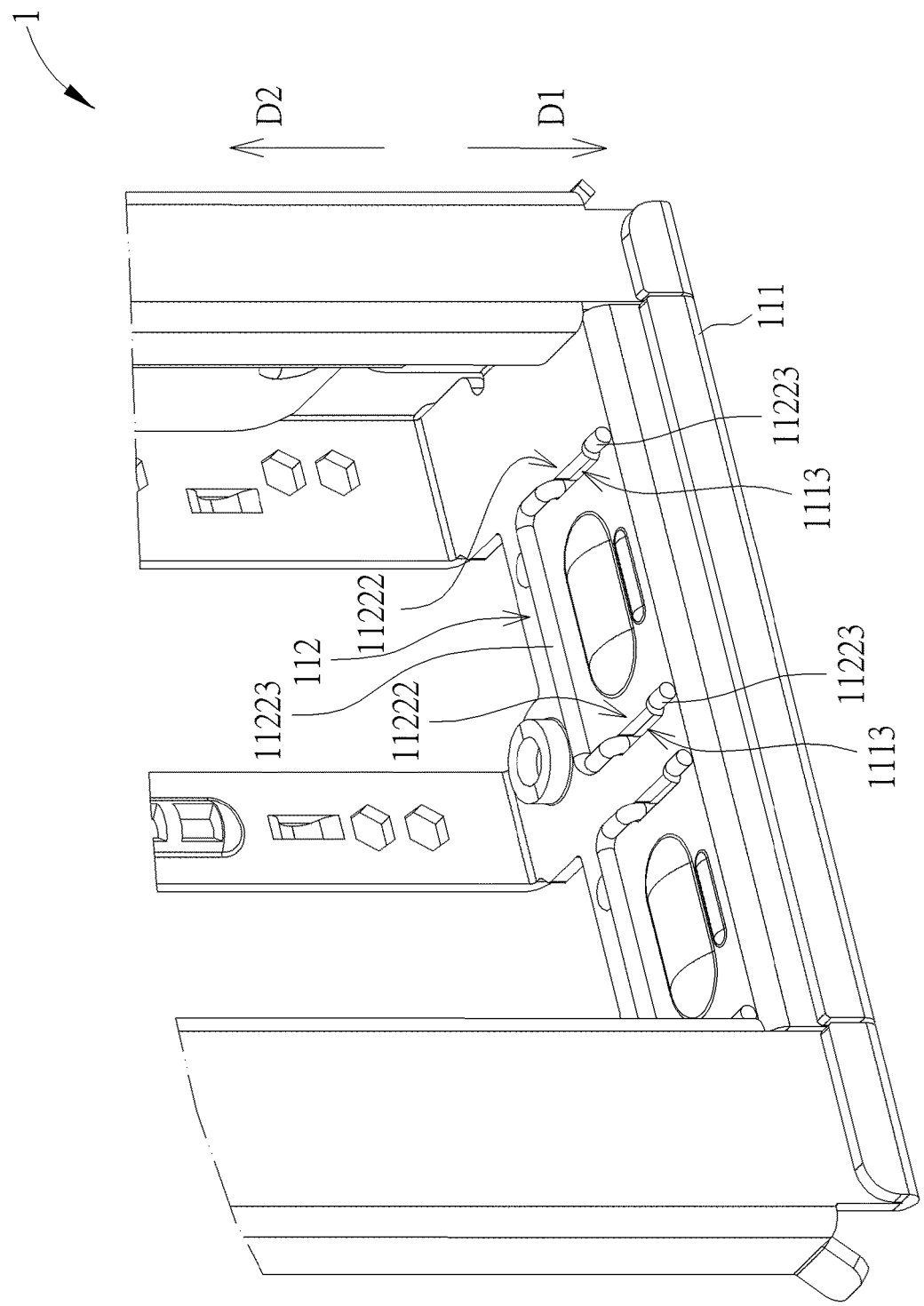
Figure 15:
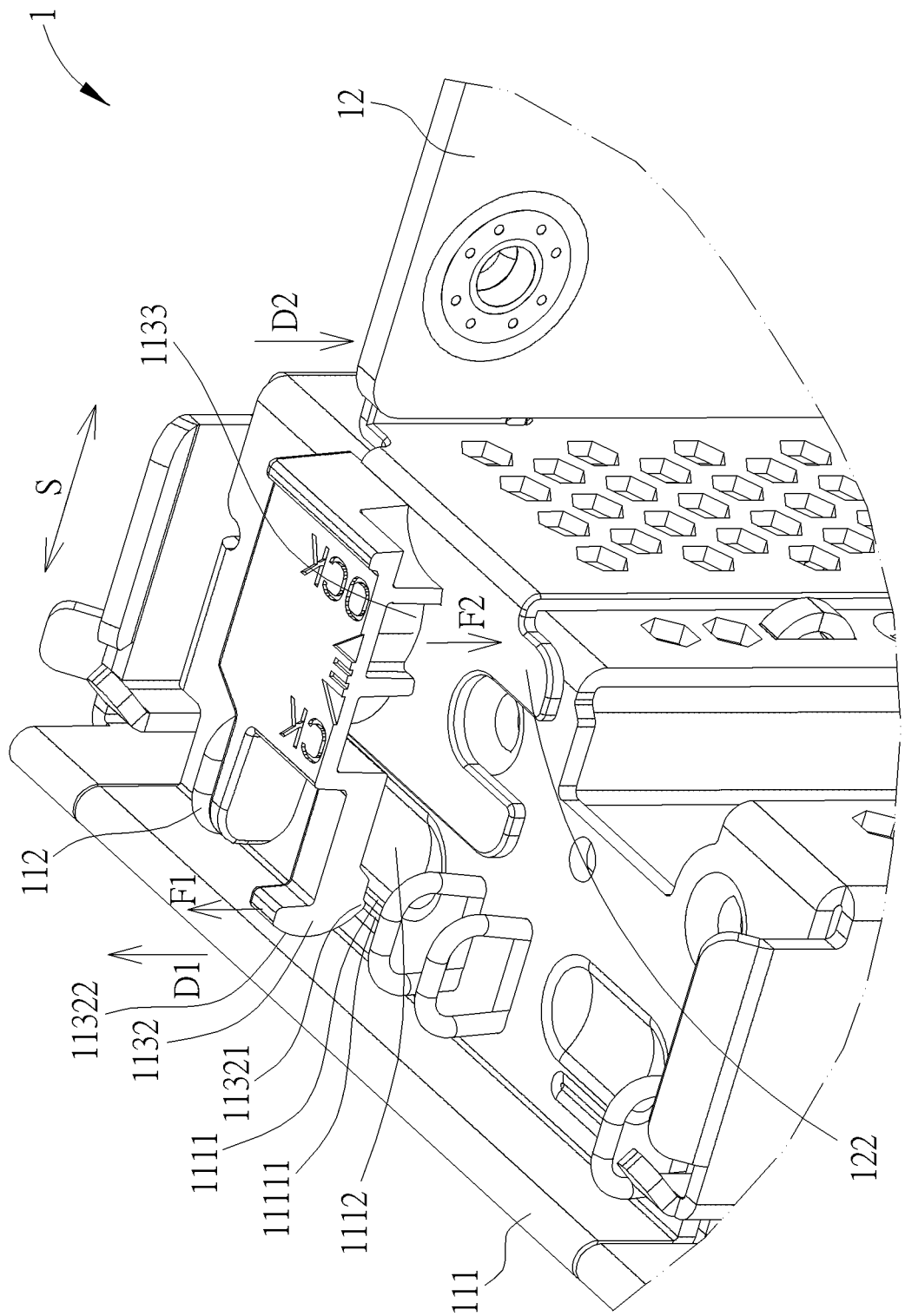
FIG. 15 is a partial enlarged diagram of the electronic apparatus as the latch is located at a locking position according to the embodiment of the present invention.
Figure 16:
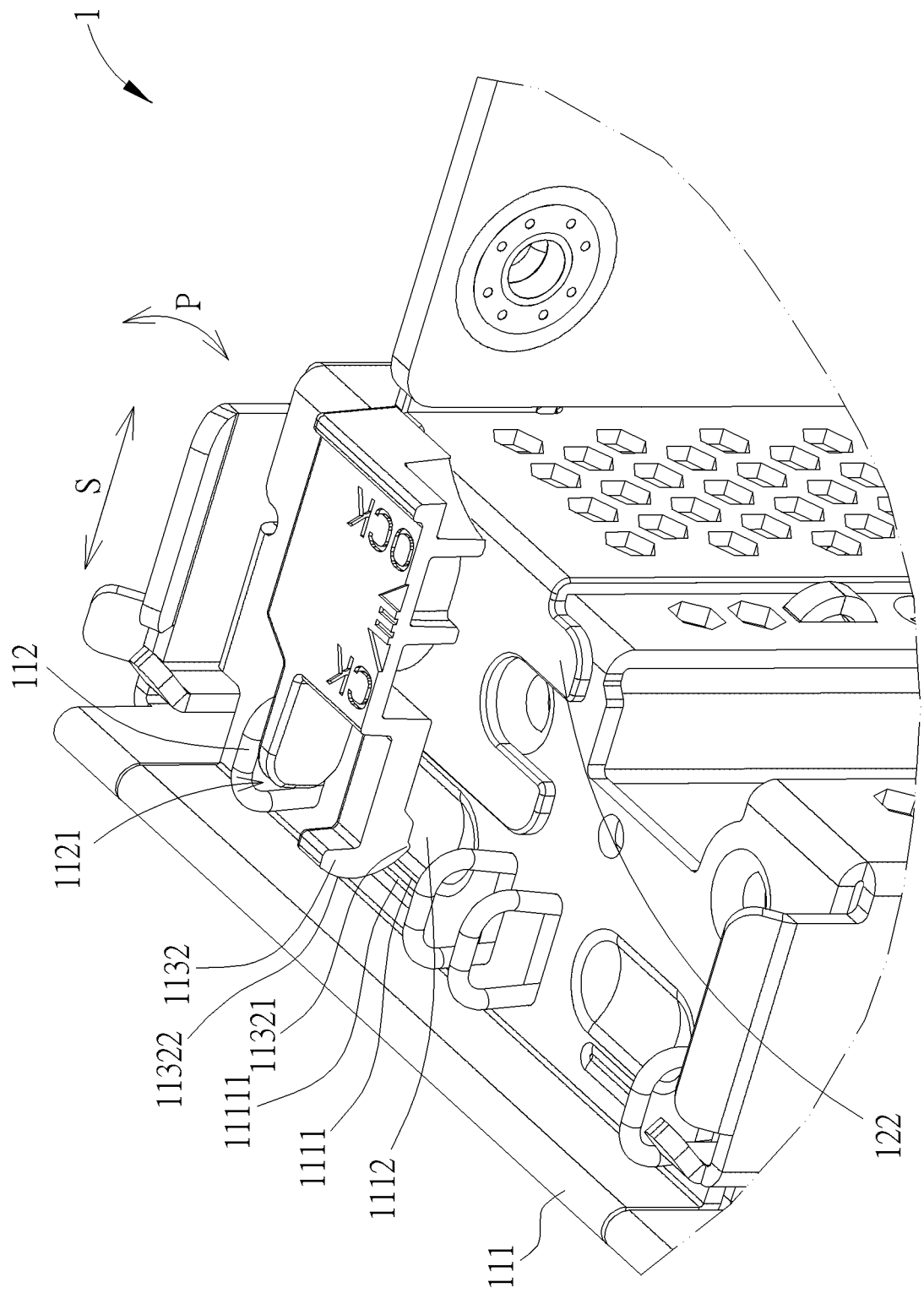
FIG. 16 is a partial enlarged diagram of the electronic apparatus as the latch is located at a non-locking position according to the embodiment of the present invention.
Figure 17:
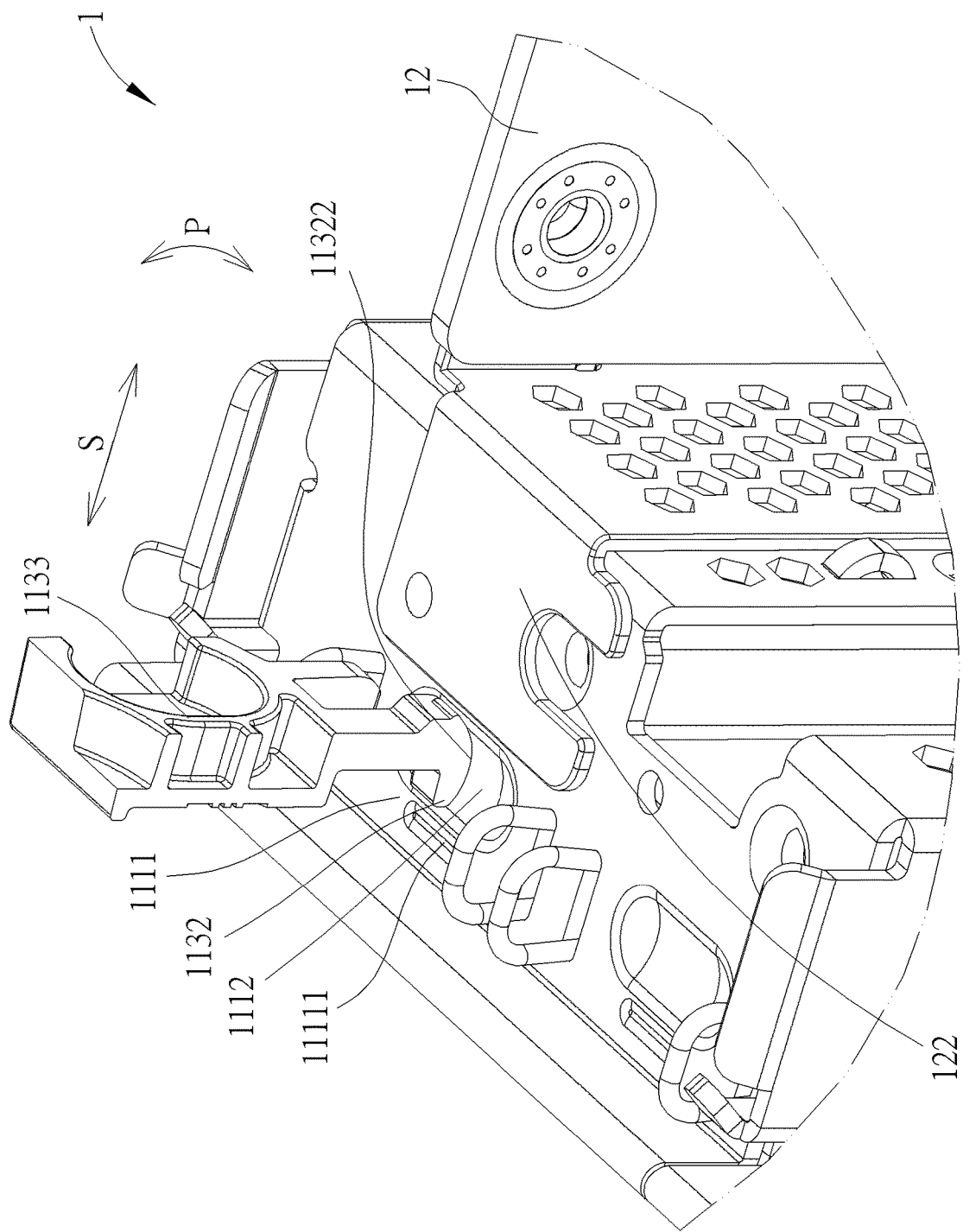
FIG. 17 is a partial enlarged diagram of the electronic apparatus as the latch is located at a pivotable position according to the embodiment of the present invention.

Please refer to FIG. 2 to FIG. 4 and FIG. 6 to FIG. 17. FIG. 7 to FIG. 9 are diagrams of the latch 113 at different views according to the embodiment of the present invention. FIG. 10 is a diagram of the base 112 according to the embodiment of the present invention. FIG. 11 and FIG. 12 are diagrams of the electronic apparatus 1 at different views as the base 112 is disposed on the case 111 according to the embodiment of the present invention. FIG. 13 and FIG. 14 are partial enlarged diagrams of the electronic apparatus 1 at different views as the base 112 is disposed on the case 111 according to the embodiment of the present invention. FIG. 15 is a partial enlarged diagram of the electronic apparatus 1 as the latch 113 is located at the locking position according to the embodiment of the present invention. FIG. 16 is a partial enlarged diagram of the electronic apparatus 1 as the latch 113 is located at the non-locking position according to the embodiment of the present invention. FIG. 17 is a partial enlarged diagram of the electronic apparatus 1 as the latch 113 is located at the pivotable position according to the embodiment of the present invention. As shown in FIG. 2 to FIG. 4 and FIG. 6 to FIG. 17, two accommodating portions 1121 are formed on the base 112. The latch 113 includes two pivoting portions 1131 respectively passing through the two accommodating portions 1121. The latch 113 is slidable and/or pivotable relative to the base 112 by a cooperation of each of the pivoting portions 1131 and the corresponding accommodating portion 1121, so as to be switchable relative to the case 111 between the locking position, the non-locking position and the pivotable position.

Specifically, each of the pivoting portions 1131 extends along an extending direction E perpendicular to the sliding direction S. The two accommodating portions 1121 are arranged along the extending direction E. Each of the accommodating portions 1121 can be a long slot, and a longitudinal direction of each of the long slots can extend along the sliding direction S.

However, the numbers of the accommodating portion and the pivoting portion are not limited to this embodiment. For example, in another embodiment, the chassis device can include only one pivoting portion extending from one side of a main body of the latch and one accommodating portion formed on the base and located at a position corresponding to the pivoting portion.

As shown in FIG. 7 to FIG. 9, the latch 113 further includes a first abutting portion 1132 and a second abutting portion 1133. The latch 113 can be a lever structure. A pivoting axis R of each of the pivoting portions 1131 is coincided with a fulcrum O of the lever structure. The first abutting portion 1132 and the second abutting portion 1133 are respectively located at two opposite sides of the fulcrum O of the lever structure. In other words, the first abutting portion 1132 and the second abutting portion 1133 are respectively located at two opposite sides of the pivoting axis R of the pivoting portion 1131. When the latch 113 is located at the locking position as shown in FIG. 2 and FIG. 15 relative to the case 111, the first abutting portion 1132 and the second abutting portion 1133 respectively abut against the case 111 and the expansion device 12. When the first abutting portion 1132 and the second abutting portion 1133 respectively abut against the case 111 and the expansion device 12, the case 111 provides a first acting force F1 along a first direction D1 onto the first abutting portion 1132, so that the second abutting portion 1133 provides a second acting force F2 along a second direction D2 opposite to the first direction D1 onto the expansion device 12 for restraining the detachment of the expansion device 12. When the latch 113 pivots relative to the case 111 to the pivotable position as shown in FIG. 4 and FIG. 17, the second abutting portion 1133 can be driven to move, so as not to abut against the expansion device 12, i.e., the second abutting portion 1133 can be driven to move to be separated from the expansion device 12, for allowing the detachment of the expansion device 12.

As shown in FIG. 2 to FIG. 4 and FIG. 11 to FIG. 17, the case 111 includes a cooperating portion 1111. The cooperating portion 1111 is for abutting against the first abutting portion 1132 when the latch 113 is located at the locking position as shown in FIG. 2 and FIG. 15.

Furthermore, in order to prevent the first abutting portion 1132 from being accidentally disengaged from the cooperating portion 1111, the first abutting portion 1132 includes a first engaging portion 11321. The cooperating portion 1111 includes a second engaging portion 11111. When the cooperating portion 11111 abuts against the first abutting portion 1132, the first engaging portion 11321 engages with the second engaging portion 11111. Preferably, the first engaging portion 11321 can be an engaging protrusion, and the second engaging portion 11111 can be an engaging recess. Such configuration can effectively prevent the latch 113 from accidentally leaving from the locking position because a user must apply a certain external force onto the latch 113 to drive the first engaging portion 11321 to disengage from the second engaging portion 11111 along the sliding direction S, so as to move the latch 113 away from the locking position. However, the present invention is not limited to this embodiment. For example, in another embodiment, the first engaging portion and the second engaging portion can be an engaging recess and an engaging protrusion respectively. Alternatively, in another embodiment, the first abutting portion and the cooperating portion can be two abutting flat surfaces.

As shown in FIG. 2 to FIG. 4 and FIG. 11 to FIG. 17, the case 111 further includes an avoiding portion 1112. The avoiding portion 1112 and the cooperating portion 1111 are arranged along the sliding direction S. The avoiding portion 1112 is for providing a moving space to the first abutting portion 1132 for allowing the latch 113 to pivot from the non-locking position as shown in FIG. 3 and FIG. 16 to the pivotable position as shown in FIG. 4 and FIG. 17 after the latch 113 slides from the locking position as shown in FIG. 2 and FIG. 15 to the non-locking position as shown in FIG. 3 and FIG. 16 along the sliding direction S.

Moreover, in order to allow the latch 113 to pivot to the pivotable position smoothly, the avoiding portion 1112 can be a recess. Preferably, the avoiding portion 1112 can be an arc-shaped recess. The first abutting portion 1132 includes an arc-shaped cooperating structure 11322. A curvature of the avoiding portion 1112 can match with a curvature of the arc-shaped cooperating structure 11322. A center of the curvature of the avoiding portion 1112 and a center of the curvature of the arc-shaped cooperating structure 11322 can be coincided with the pivoting axis R of the corresponding pivoting portion 1131. Such configuration can allow the latch 113 to smoothly pivot from the non-locking position to the pivotable position around the pivoting axis R of the corresponding pivoting portion 1131 by a sliding cooperation of the avoiding portion 1112 and the arc-shaped cooperating structure 11322.

However, the present invention is not limited to this embodiment. For example, in another embodiment, the avoiding portion can be a rectangular recess, a rectangular hole or any other structure which can provide the moving space to the first abutting portion.

In addition, as shown in FIG. 2 to FIG. 4 and FIG. 7 to FIG. 9, in order to improve using convenience of the latch 113, the latch 113 further includes a main body 1134 and a resilient arm 1135 extending from the main body 1134 along the sliding direction S. The first abutting portion 1132 is formed on an end of the resilient arm 1135 away from the main body 1134. The second abutting portion 1133 is formed on the main body 1134. The resilient arm 1135 is configured to be pushed by the case 111 to resiliently deform. In such a way, when the latch 113 reaches the locking position as shown in FIG. 2 and FIG. 15, the resilient arm 1135 can drive the first abutting portion 1132 to drive the first engaging portion 11321 to knock the second engaging portion 11111 for reminding the user of that the latch 113 has been moved to the locking position. On the other hand, when the latch 113 reaches the non-locking position as shown in FIG. 3 and FIG. 16, the resilient arm 1135 can drive the first abutting portion 1132 to drive the first engaging portion 11321 to knock the avoiding portion 1112 for reminding the user of that the latch 113 has been moved to the non-locking position.

Besides, as shown in FIG. 10 to FIG. 17, the base 112 can be a one-piece structure bent from a stripe-shaped structure, a rod-shaped structure, a string-shaped structure or a wire-shaped structure. The base 112 includes two bending parts 1122. Each of the two bending parts 1122 is formed in a U shape. Each of the accommodating portions 1121 is formed within a space enclosed by the corresponding bending part 1122 and between two sides of the corresponding bending part 1122. Each of the bending parts 1122 includes a closed end portion 11221 and an open end portion 11222. Two through slots 1113 are formed on the case 111. The closed end portion 11221 and the open end portion 11222 are respectively located at two opposite sides of the corresponding through slot 1113 when each of the bending parts 1122 passes through the corresponding through slot 1113.

Preferably, a width of the closed end portion 11221 is greater than a width of the open end portion 11222. A width of each of through slots 1113 is less than the width of the closed end portion 11221 and less than the width of the open end portion 11222. The two sides of each of the bending parts 1122 are forced to resiliently deform and abut against a wall of the corresponding through slot 1113 during a process that each of the bending parts 1122 passes through the corresponding through slot 1113.

Furthermore, each of the bending parts 1122 further includes at least one stopping portion 11223 connected to the open end portion 11222. The at least one stopping portion 11223 abuts against the case 111 for preventing each of the bending parts 1122 from being accidentally disengaged from the corresponding through slot 1113 along the first direction D1 when each of the bending parts 1122 passes through the corresponding through slot 1113.

However, the material and the structure of the base are not limited to this embodiment. For example, in another embodiment, the width of the through slot can be less than the width of the closed end portion and greater than the width of the open end portion. Alternatively, in another embodiment, the width of the open end portion can be equal to the width of the closed end portion and greater than the width of the through slot. Alternatively, in another embodiment, the base can be a plate-shaped structure or a block-shaped structure made of plastic material and with the accommodating portion, and the base can be fixed onto the case by welding or screwing manners.

Detailed description for the operational principle of the chassis device 11 is provided as follows. When the expansion device 12 is installed on the base plate 13 by the insertion of the pin assembly 121 into the expansion slot 131, the user can operate the latch 113 to move the latch 113 to the locking position as shown in FIG. 2 and FIG. 15. At this moment, the first abutting portion 1132 and the second abutting portion 1133 respectively abut against the case 111 and the expansion device 12, and the first abutting portion 1132 is forced by the case 111 along the first direction D1 to drive the second abutting portion 1133 to press the bracket 122 of the expansion device 12 along the second direction D2. Therefore, the bracket 122 of the expansion device 12 is clamped by the latch 113 and the case 111 for restraining the detachment of the expansion device 12. When it is desired to detach the expansion device 12, the user can force the latch 113 to drive the first engaging portion 11321 to disengage from the second engaging portion 11111 along the sliding direction S, so as to drive the latch 113 to slide relative to the case 111 from the locking position as shown in FIG. 2 and FIG. 15 to the non-locking position as shown in FIG. 3 and FIG. 16. When the latch 113 is located at the non-locking position as shown in FIG. 3 and FIG. 16 relative to the case 111, the avoiding portion 1112 provides the moving space to the first abutting portion 1132. Afterwards, the user can further operate the latch 113 to pivot from the non-locking position as shown in FIG. 3 and FIG. 16 to the pivotable position as shown in FIG. 4 and FIG. 17 to drive the second abutting portion 1133 to move, so that the second abutting portion 1133 does not abut against the expansion device 12 and the latch 113 leaves away from a detachment path of the expansion device 12, for allowing the detachment of the expansion device 12.

In contrast to the prior art, in the present invention, the latch can slide and/or pivot relative to the base by the cooperation of the pivoting portion and the accommodating portion to switch relative to the case between the locking position, the non-locking position and the pivotable position. When the latch is located at the locking position relative to the case, the latch abuts against the case and the expansion device for restraining detachment of the expansion device. When it is desired to detach the expansion device, the latch can be operated to slide relative to the case from the locking position to the non-locking position and then further to pivot relative to the case to the pivotable position, so that the latch does not abut against the expansion device for allowing the detachment of the expansion device. Therefore, the present invention has better using convenience. Besides, the aforementioned configuration is space-saving and does not require a large aperture formed on the case. Therefore, the present invention can have better space utilization and comply with safety standards.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chassis device adapted for an expansion device, the chassis device comprising:
   a case comprising an avoiding portion;
   a base disposed on the case, at least one accommodating portion being formed on the base; and
   a latch comprising at least one pivoting portion, a first abutting portion and a second abutting portion, the at least one pivoting portion being movably disposed through the at least one accommodating portion, the latch being slidable between a locking position and a non-locking position, the first abutting portion and the second abutting portion respectively abutting against the case and the expansion device when the latch is located at the locking position, and the avoiding portion allowing the latch to pivot when the latch is located at the non-locking position.

2. The chassis device of claim 1, wherein the case further comprises a cooperating portion, and the cooperating portion abuts against the first abutting portion when the latch is located at the locking position.

3. The chassis device of claim 2, wherein the avoiding portion is located at a position corresponding to the first abutting portion of the latch located at the non-locking position, and the cooperating portion is located at a position corresponding to the first abutting portion of the latch located at the locking position.

4. The chassis device of claim 3, wherein the first abutting portion comprises a first engaging portion, the cooperating portion comprises a second engaging portion, and the first engaging portion engages with the second engaging portion when the cooperating portion abuts against the first abutting portion.

5. The chassis device of claim 4, wherein the first engaging portion is an engaging protrusion, and the second engaging portion is an engaging recess.

6. The chassis device of claim 1, wherein the avoiding portion is a groove or a hole.

7. The chassis device of claim 6, wherein the avoiding portion is an arc-shaped groove, the first abutting portion comprises an arc-shaped cooperating structure, a curvature of the avoiding portion matches with a curvature of the arc-shaped cooperating structure, a center of the curvature of the avoiding portion and a center of the curvature of the arc-shaped cooperating structure are coincided with a pivoting axis of the at least one pivoting portion, and the latch pivots away from the non-locking position by a sliding cooperation of the avoiding portion and the arc-shaped cooperating structure.

8. The chassis device of claim 1, wherein the first abutting portion is forced by the case along a first direction for driving the second abutting portion to press the expansion device along a second direction opposite to the first direction when the first abutting portion and the second abutting portion respectively abut against the case and the expansion device.

9. The chassis device of claim 1, wherein the latch further comprises a main body and a resilient arm extending from the main body along a sliding direction of the latch, and the first abutting portion is formed on an end of the resilient arm away from the main body.

10. The chassis device of claim 9, wherein the resilient arm is forced to resiliently deform when the first abutting portion abuts against the case.

11. The chassis device of claim 1, wherein the base is a one-piece structure bent from a stripe-shaped structure, a rod-shaped structure, a string-shaped structure or a wire-shaped structure.

12. The chassis device of claim 11, wherein the base comprises at least one bending part formed in a U shape, and the at least one accommodating portion is formed between two sides of the at least one bending part.

13. The chassis device of claim 12, wherein the at least one bending part comprises a closed end portion and an open end portion, at least one through slot is formed on the case, and the closed end portion and the open end portion are respectively located at two opposite sides of the at least one through slot when the at least one bending part passes through the at least one through slot.

14. The chassis device of claim 13, wherein a width of the at least one through slot is less than a width of the closed end portion, and the two sides of the at least one bending part are forced to resiliently deform during a process that the at least one bending part passes through the at least one through slot.

15. The chassis device of claim 14, wherein the width of the at least one through slot is less than a width of the open end portion.

16. The chassis device of claim 14, wherein the width of the closed end portion is greater than a width of the open end portion.

17. The chassis device of claim 13, wherein the at least one bending part further comprises at least one stopping portion connected to the open end portion, and the at least one stopping portion abuts against the case when the at least one bending part passes through the at least one through slot.

18. A server comprising:
   an expansion device; and
   a chassis device comprising:
      a case comprising an avoiding portion;
      a base disposed on the case, at least one accommodating portion being formed on the base; and
      a latch comprising at least one pivoting portion, a first abutting portion and a second abutting portion, the at least one pivoting portion being movably disposed through the at least one accommodating portion, the latch being slidable between a locking position and a non-locking position, the first abutting portion and the second abutting portion respectively abutting against the case and the expansion device when the latch is located at the locking position, and the avoiding portion allowing the latch to pivot when the latch is located at the non-locking position.

19. The server of claim 18, wherein the avoiding portion is an arc-shaped groove, the first abutting portion comprises an arc-shaped cooperating structure, a curvature of the avoiding portion matches with a curvature of the arc-shaped cooperating structure, a center of the curvature of the avoiding portion and a center of the curvature of the arc-shaped cooperating structure are coincided with a pivoting axis of the at least one pivoting portion, and the latch pivots away from the non-locking position by a sliding cooperation of the avoiding portion and the arc-shaped cooperating structure.

20. The server of claim 18, wherein the base is a one-piece structure bent from a stripe-shaped structure, a rod-shaped structure, a string-shaped structure or a wire-shaped structure, the base comprises at least one bending part formed in a U shape, the at least one accommodating portion is formed between two sides of the at least one bending part, the at least one bending part comprises a closed end portion and an open end portion, at least one through slot is formed on the case, and the closed end portion and the open end portion are respectively located at two opposite sides of the at least one through slot when the at least one bending part passes through the at least one through slot.

* * * * *